US010714710B2

(12) United States Patent
Woo et al.

(10) Patent No.: US 10,714,710 B2
(45) Date of Patent: Jul. 14, 2020

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Junhyuk Woo, Yongin-si (KR); Jeongwon Kim, Yongin-si (KR); Jinho Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/681,108

(22) Filed: Aug. 18, 2017

(65) Prior Publication Data
US 2018/0053918 A1 Feb. 22, 2018

(30) Foreign Application Priority Data

Aug. 19, 2016 (KR) ........................ 10-2016-0105590

(51) Int. Cl.
*H01L 51/52* (2006.01)
*H01L 51/00* (2006.01)
(Continued)

(52) U.S. Cl.
CPC ........ *H01L 51/5284* (2013.01); *H01L 27/322* (2013.01); *H01L 27/3244* (2013.01); *H01L 51/0034* (2013.01); *H01L 51/0061* (2013.01); *H01L 51/0072* (2013.01); *H01L 51/0096* (2013.01); *H01L 51/0097* (2013.01); *H01L 51/5234* (2013.01); *H01L 51/5253* (2013.01); *H01L 51/5281* (2013.01);
(Continued)

(58) Field of Classification Search
CPC . H01L 51/5284; H01L 51/0096; H01L 51/56; H01L 51/0072; H01L 27/322; H01L 51/5253; H01L 27/3244; H01L 51/0097; H01L 51/0061; H01L 51/0034; H01L 51/5234; H01L 51/5281; H01L 2251/558; H01L 2227/323; H01L 2251/5338; H01L 27/3272; H01L 51/5293; G02F 1/136209; G02F 1/133512; G02F 1/138512
See application file for complete search history.

(56) References Cited

U.S. PATENT DOCUMENTS 9,627,636 B2 * 4/2017 Heo .................... H01L 51/0097
2006/0263628 A1 * 11/2006 Aziz ................... H01L 51/5206
428/690
(Continued)

FOREIGN PATENT DOCUMENTS

JP 2007-322650 A 12/2007
KR 10-2010-0033866 A 3/2010
(Continued)

*Primary Examiner* — Latanya N Crawford
(74) *Attorney, Agent, or Firm* — Lewis Roca Rothgerber Christie LLP

(57) ABSTRACT

Provided is an organic light-emitting display apparatus including a substrate including a black pigment; a pixel electrode above the substrate; a pixel defining layer above the pixel electrode and having an opening for exposing at least a portion of the pixel electrode; an intermediate layer above the pixel electrode and including an emission layer (EML); and an opposite electrode above the intermediate layer.

18 Claims, 11 Drawing Sheets

(51) Int. Cl.
*H01L 27/32* (2006.01)
*H01L 51/56* (2006.01)
(52) U.S. Cl.
CPC ........ *H01L 51/56* (2013.01); *H01L 2227/323* (2013.01); *H01L 2251/5338* (2013.01); *H01L 2251/558* (2013.01); *Y02E 10/549* (2013.01)

(56) References Cited

U.S. PATENT DOCUMENTS

| | | | |
|---|---|---|---|
| 2008/0218064 A1* | 9/2008 | Cho | H01L 27/322 313/504 |
| 2011/0006327 A1 | 1/2011 | Park et al. | |
| 2011/0123754 A1* | 5/2011 | Shirai | B32B 7/12 428/41.8 |
| 2011/0147721 A1* | 6/2011 | Han | G02B 5/3033 257/40 |
| 2014/0191203 A1* | 7/2014 | Son | H01L 51/5284 257/40 |
| 2014/0367652 A1 | 12/2014 | Cho et al. | |
| 2016/0111666 A1 | 4/2016 | Jung et al. | |
| 2016/0181336 A1* | 6/2016 | Tokuda | H04N 9/30 257/40 |
| 2016/0181338 A1* | 6/2016 | Heo | H01L 51/0097 257/40 |
| 2017/0194398 A1* | 7/2017 | Kim | H01L 27/3216 |

FOREIGN PATENT DOCUMENTS

| | | |
|---|---|---|
| KR | 10-2014-0028391 A | 3/2014 |
| KR | 10-2016-0046978 A | 5/2016 |

* cited by examiner

FIG. 9A

| PERCENTAGE / SUBSTRATE THICKNESS | 0.00% | 0.10% | 0.50% | 1.00% | 2.00% |
|---|---|---|---|---|---|
| 5um | 10.00% | 10.70% | 41.30% | 62.20% | 79.70% |
| 6um | 10.40% | 12.70% | 46.60% | 67.50% | 82.90% |
| 7um | 10.70% | 14.60% | 51.30% | 71.60% | 85.20% |
| 8um | 11.00% | 16.40% | 55.40% | 74.90% | 86.90% |
| 9um | 11.20% | 18.20% | 59.00% | 77.60% | 88.20% |
| 10um | 11.40% | 20.00% | 62.20% | 79.70% | 89.20% |
| 11um | 11.50% | 21.70% | 65.00% | 81.50% | 90.10% |
| 12um | 11.60% | 23.40% | 67.50% | 82.90% | 90.90% |
| 13um | 11.80% | 25.00% | 69.70% | 84.20% | 91.50% |
| 14um | 11.90% | 26.60% | 71.60% | 85.20% | 92.10% |
| 15um | 12.00% | 28.10% | 73.40% | 86.10% | 92.60% |
| 16um | 12.10% | 29.60% | 74.90% | 86.90% | 93.10% |
| 17um | 12.10% | 31.00% | 76.30% | 87.60% | 93.60% |
| 18um | 12.20% | 31.00% | 77.60% | 88.20% | 94.00% |
| 19um | 12.30% | 31.00% | 78.70% | 88.70% | 94.30% |
| 20um | 12.40% | 31.00% | 79.70% | 89.20% | 94.70% |
| 21um | 12.40% | 31.00% | 80.60% | 89.70% | 95.00% |
| 22um | 12.50% | 31.00% | 81.50% | 90.10% | 95.30% |
| 23um | 12.50% | 31.00% | 82.20% | 90.50% | 95.60% |
| 24um | 12.60% | 40.10% | 82.90% | 90.90% | 95.80% |
| 25um | 12.60% | 41.30% | 83.60% | 91.20% | 96.10% |
| 26um | 12.70% | 42.40% | 84.20% | 91.50% | 96.30% |
| 27um | 12.70% | 43.50% | 84.70% | 91.80% | 96.50% |
| 28um | 12.70% | 44.60% | 85.20% | 92.10% | 96.70% |
| 29um | 12.80% | 45.60% | 85.70% | 92.40% | 96.90% |
| 30um | 12.80% | 46.60% | 86.10% | 92.60% | 97.00% |
| 31um | 12.90% | 47.60% | 86.50% | 92.90% | 97.20% |
| 32um | 12.90% | 48.60% | 86.90% | 93.10% | 97.40% |
| 33um | 12.90% | 49.50% | 87.20% | 93.30% | 97.50% |
| 34um | 12.90% | 50.40% | 87.60% | 93.60% | 97.60% |
| 35um | 13.00% | 51.30% | 87.90% | 93.80% | 97.80% |
| 36um | 13.00% | 52.20% | 88.20% | 94.00% | 97.90% |
| 37um | 13.00% | 53.00% | 88.50% | 94.10% | 98.00% |
| 38um | 13.10% | 53.80% | 88.70% | 94.30% | 98.10% |
| 39um | 13.10% | 54.60% | 89.00% | 94.50% | 98.20% |
| 40um | 13.10% | 55.40% | 89.20% | 94.70% | 98.30% |

FIG. 9B

| PERCENTAGE / SUBSTRATE THICKNESS | 3.00% | 4.00% | 5.00% | 6.00% | 7.00% |
|---|---|---|---|---|---|
| 5um | 86.10% | 89.20% | 91.20% | 92.60% | 93.80% |
| 6um | 88.20% | 90.90% | 92.60% | 94.00% | 95.00% |
| 7um | 89.70% | 92.10% | 93.80% | 95.00% | 95.90% |
| 8um | 90.90% | 93.10% | 94.70% | 95.80% | 96.70% |
| 9um | 91.80% | 94.00% | 95.40% | 96.50% | 97.30% |
| 10um | 92.60% | 94.70% | 96.10% | 97.00% | 97.80% |
| 11um | 93.30% | 95.30% | 96.60% | 97.50% | 98.20% |
| 12um | 94.00% | 95.80% | 97.00% | 97.90% | 98.50% |
| 13um | 94.50% | 96.30% | 97.40% | 98.20% | 98.70% |
| 14um | 95.00% | 96.70% | 97.80% | 98.50% | 98.90% |
| 15um | 95.40% | 97.00% | 98.00% | 98.70% | 99.10% |
| 16um | 95.80% | 97.40% | 98.30% | 98.90% | 99.30% |
| 17um | 96.20% | 97.60% | 98.50% | 99.10% | 99.40% |
| 18um | 96.50% | 97.90% | 98.70% | 99.20% | 99.50% |
| 19um | 96.80% | 98.10% | 98.90% | 99.30% | 99.60% |
| 20um | 97.00% | 98.30% | 99.00% | 99.40% | 99.60% |
| 21um | 97.30% | 98.50% | 99.10% | 99.50% | 99.70% |
| 22um | 97.50% | 98.60% | 99.20% | 99.60% | 99.70% |
| 23um | 97.70% | 98.80% | 99.30% | 99.60% | 99.80% |
| 24um | 97.90% | 98.90% | 99.40% | 99.70% | 99.80% |
| 25um | 98.00% | 99.00% | 99.50% | 99.70% | 99.90% |
| 26um | 98.20% | 99.10% | 99.50% | 99.80% | 99.90% |
| 27um | 98.30% | 99.20% | 99.60% | 99.80% | 99.90% |
| 28um | 98.50% | 99.30% | 99.60% | 99.80% | 99.90% |
| 29um | 98.60% | 99.30% | 99.70% | 99.80% | 99.90% |
| 30um | 98.70% | 99.40% | 99.70% | 99.90% | 99.90% |
| 31um | 98.80% | 99.50% | 99.80% | 99.90% | 99.90% |
| 32um | 98.90% | 99.50% | 99.80% | 99.90% | 100.00% |
| 33um | 99.00% | 99.60% | 99.80% | 99.90% | 100.00% |
| 34um | 99.10% | 99.60% | 99.80% | 99.90% | 100.00% |
| 35um | 99.10% | 99.60% | 99.90% | 99.90% | 100.00% |
| 36um | 99.20% | 99.70% | 99.90% | 99.90% | 100.00% |
| 37um | 99.30% | 99.70% | 99.90% | 100.00% | 100.00% |
| 38um | 99.30% | 99.70% | 99.90% | 100.00% | 100.00% |
| 39um | 99.40% | 99.80% | 99.90% | 100.00% | 100.00% |
| 40um | 99.40% | 99.80% | 99.90% | 100.00% | 100.00% |

FIG. 9C

| PERCENTAGE / SUBSTRATE THICKNESS | 8.00% | 9.00% | 10.00% | 12.50% | 15.00% |
|---|---|---|---|---|---|
| 5um | 94.70% | 95.40% | 96.10% | 97.20% | 98.00% |
| 6um | 95.80% | 96.50% | 97.00% | 98.00% | 98.70% |
| 7um | 96.70% | 97.30% | 97.80% | 98.60% | 99.10% |
| 8um | 97.40% | 97.90% | 98.30% | 99.00% | 99.40% |
| 9um | 97.90% | 98.30% | 98.70% | 99.30% | 99.60% |
| 10um | 98.30% | 98.70% | 99.00% | 99.50% | 99.70% |
| 11um | 98.60% | 99.00% | 99.20% | 99.60% | 99.80% |
| 12um | 98.90% | 99.20% | 99.40% | 99.70% | 99.90% |
| 13um | 99.10% | 99.40% | 99.50% | 99.80% | 99.90% |
| 14um | 99.30% | 99.50% | 99.60% | 99.90% | 99.90% |
| 15um | 99.40% | 99.60% | 99.70% | 99.90% | 100.00% |
| 16um | 99.50% | 99.70% | 99.80% | 99.90% | 100.00% |
| 17um | 99.60% | 99.70% | 99.80% | 99.90% | 100.00% |
| 18um | 99.70% | 99.80% | 99.90% | 100.00% | 100.00% |
| 19um | 99.70% | 99.80% | 99.90% | 100.00% | 100.00% |
| 20um | 99.80% | 99.90% | 99.90% | 100.00% | 100.00% |
| 21um | 99.80% | 99.90% | 99.90% | 100.00% | 100.00% |
| 22um | 99.90% | 99.90% | 100.00% | 100.00% | 100.00% |
| 23um | 99.90% | 99.90% | 100.00% | 100.00% | 100.00% |
| 24um | 99.90% | 99.90% | 100.00% | 100.00% | 100.00% |
| 25um | 99.90% | 100.00% | 100.00% | 100.00% | 100.00% |
| 26um | 99.90% | 100.00% | 100.00% | 100.00% | 100.00% |
| 27um | 99.90% | 100.00% | 100.00% | 100.00% | 100.00% |
| 28um | 100.00% | 100.00% | 100.00% | 100.00% | 100.00% |
| 29um | 100.00% | 100.00% | 100.00% | 100.00% | 100.00% |
| 30um | 100.00% | 100.00% | 100.00% | 100.00% | 100.00% |
| 31um | 100.00% | 100.00% | 100.00% | 100.00% | 100.00% |
| 32um | 100.00% | 100.00% | 100.00% | 100.00% | 100.00% |
| 33um | 100.00% | 100.00% | 100.00% | 100.00% | 100.00% |
| 34um | 100.00% | 100.00% | 100.00% | 100.00% | 100.00% |
| 35um | 100.00% | 100.00% | 100.00% | 100.00% | 100.00% |
| 36um | 100.00% | 100.00% | 100.00% | 100.00% | 100.00% |
| 37um | 100.00% | 100.00% | 100.00% | 100.00% | 100.00% |
| 38um | 100.00% | 100.00% | 100.00% | 100.00% | 100.00% |
| 39um | 100.00% | 100.00% | 100.00% | 100.00% | 100.00% |
| 40um | 100.00% | 100.00% | 100.00% | 100.00% | 100.00% |

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2016-0105590, filed on Aug. 19, 2016, in the Korean Intellectual Property Office, the disclosure of which is incorporated herein in its entirety by reference.

BACKGROUND

1. Field

One or more example embodiments relate to an organic light-emitting display apparatus and a method of manufacturing the organic light-emitting display apparatus.

2. Description of the Related Art

An organic light-emitting display apparatus is manufactured on an array substrate whereon thin film transistors (TFTs) and wires connecting the TFTs are formed, and thus the organic light-emitting device may display an image.

The organic light-emitting display apparatus is used in various environments, and in this regard, when the organic light-emitting display apparatus is used outdoors or in a very bright indoor environment, a contrast ratio of an image is decreased due to external light reflected from the wires and metals included in electrodes in the organic light-emitting display apparatus, thus leading to a deterioration in visibility.

In order to prevent the reflection of the external light, the organic light-emitting display apparatus may include various types of anti-reflective structures.

SUMMARY

An organic light-emitting display apparatus may include a black matrix, a color filter, and/or a polarizing layer in an anti-reflective structure. However, because a separate layer is applied to prevent, substantially prevent, or reduce reflection, a number of processes are increased and a thickness of the anti-reflective structure is increased such that flexibility of the display apparatus having the anti-reflective structure deteriorates.

Embodiments of the present disclosure may provide an organic light-emitting display apparatus and a method of manufacturing the organic light-emitting display apparatus in which a light absorbance is increased by allowing a substrate to include a black pigment, so that a thickness of an anti-reflective structure is decreased, resulting in an increase in flexibility and a decrease in external light reflectance.

Additional aspects will be set forth in part in the description which follows and, in part, will be apparent from the description, or may be learned by practice of the presented example embodiments.

According to one or more example embodiments, an organic light-emitting display apparatus includes a substrate including a black pigment; a pixel electrode above the substrate; a pixel defining layer above the pixel electrode and having an opening for exposing at least a portion of the pixel electrode; an intermediate layer above the pixel electrode and including an emission layer (EML); and an opposite electrode above the intermediate layer.

The black pigment may include at least one of aniline black ($C_{66}H_{51}Cr_3N_{11}O_{12}$), carbon black, lamp black, graphite, Paliogen® Black ($C_{40}H_{26}N_2O_4$), and perylene black ($C_{40}H_{26}N_2O_6$).

A light absorbance, of light in a visible ray range, of the substrate may be equal to or greater than about 90%.

The substrate may include polyimide (PI). The black pigment in the substrate may be carbon black. A weight percentage of the carbon black with respect to the substrate may be between about 1% and about 15%.

A thickness of the substrate may be between about 5 μm and about 40 μm.

According to one or more example embodiments, the organic light-emitting display apparatus may further include a capping layer above the opposite electrode; a cover layer above the capping layer; and a thin-film encapsulation layer above the cover layer.

According to one or more example embodiments, the organic light-emitting display apparatus may further include a polarizing layer above the thin-film encapsulation layer. In this regard, reflectance of the organic light-emitting display apparatus including the polarizing layer may be equal to or less than about 5%.

According to one or more example embodiments, the organic light-emitting display apparatus may further include a black matrix arranged above the thin-film encapsulation layer, the black matrix having an opening that exposes at least a portion of an emission area.

The opposite electrode may include a low-reflection layer.

According to one or more example embodiments, the organic light-emitting display apparatus may further include a color filter that covers the opening of the black matrix. In this regard, reflectance of the organic light-emitting display apparatus including the color filter may be equal to or less than about 5%.

According to one or more example embodiments, a method of manufacturing an organic light-emitting display apparatus may include forming a substrate by hardening a substrate composition including a black pigment; forming a pixel electrode above the substrate; forming, above the pixel electrode, a pixel defining layer having an opening for exposing at least a portion of the pixel electrode; forming, above the pixel electrode, an intermediate layer including an emission layer (EML); and forming an opposite electrode above the intermediate layer.

The black pigment may include at least one of aniline black ($C_{66}H_{51}Cr_3N_{11}O_{12}$), carbon black, lamp black, graphite, Paliogen® Black ($C_{40}H_{26}N_2O_4$), and perylene black ($C_{40}H_{26}N_2O_6$).

The substrate may include polyimide (PI). The black pigment in the substrate may include carbon black. A weight percentage of the carbon black with respect to the substrate composition may be between about 1% and about 15%.

A thickness of the substrate may be between about 5 μm and about 40 μm.

According to one or more example embodiments, after the forming of the opposite electrode, the method may further include forming a capping layer above the opposite electrode; forming a cover layer above the capping layer; and forming a thin-film encapsulation layer above the cover layer.

According to one or more example embodiments, after the forming of the thin-film encapsulation layer, the method may further include forming a polarizing layer above the thin-film encapsulation layer.

According to one or more example embodiments, after the forming of the thin-film encapsulation layer, the method may further include forming, above the thin-film encapsulation layer, a black matrix having an opening that exposes at least a portion of an emission area.

According to one or more example embodiments, after the forming of the black matrix, the method may further include forming a color filter that covers the opening of the black matrix.

BRIEF DESCRIPTION OF THE DRAWINGS

These and/or other aspects will become apparent and more readily appreciated from the following description of the example embodiments, taken in conjunction with the accompanying drawings in which:

FIGS. 9A-9C show experimental data obtained by measuring the light absorbance of substrate according to a thickness of the substrate including polyimide (PI) and a carbon black percentage (%) of the substrate according to example embodiments.

DETAILED DESCRIPTION

Figure 1:
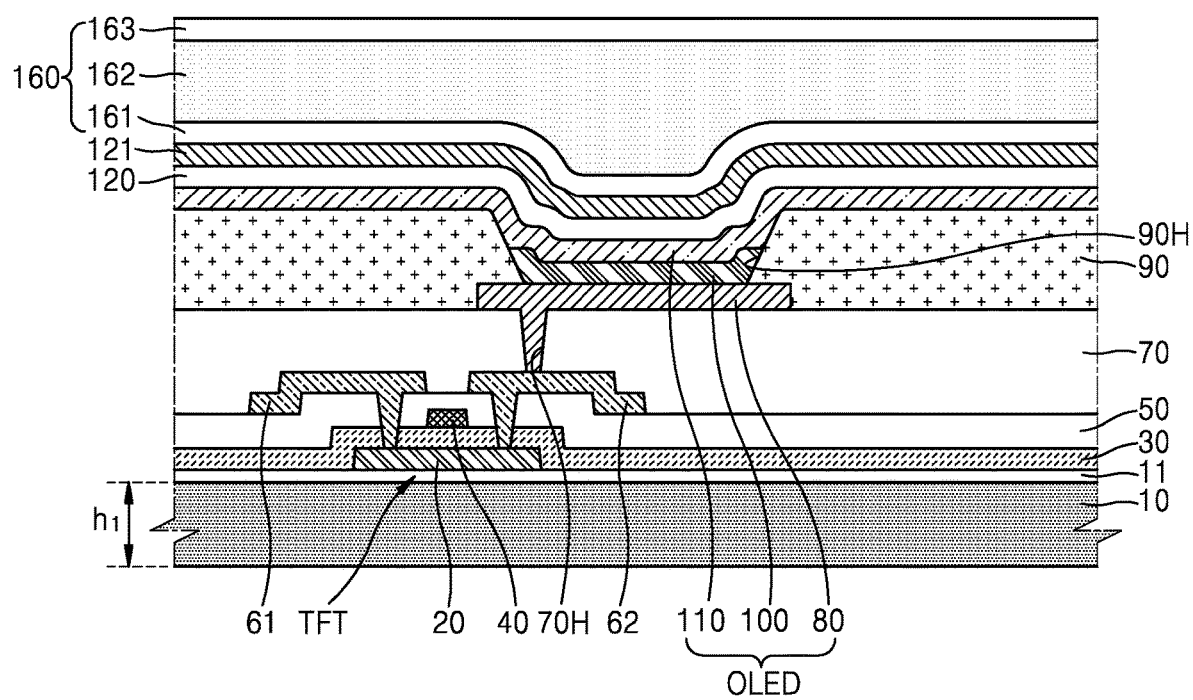
FIG. 1 is a cross-sectional view of an organic light-emitting display apparatus, according to an example embodiment.

As the disclosure allows for various suitable changes and numerous example embodiments, particular example embodiments will be illustrated in the drawings and described in detail in the written description. Effects and features of the disclosure and methods of accomplishing the same may be understood more readily by reference to the following detailed description of example embodiments and the accompanying drawings. The disclosure may, however, be embodied in many different forms and should not be construed as being limited to the example embodiments set forth herein.

Reference will now be made in detail to example embodiments, examples of which are illustrated in the accompanying drawings, wherein like reference numerals refer to like elements (or components) throughout and redundant descriptions thereof may be omitted.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

Throughout the specification, an expression used in the singular encompasses the expression of the plural, unless it has a clearly different meaning in the context.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

In the drawings, for convenience of description, the thicknesses of elements (or components) may be exaggerated for clarity. For example, the thicknesses and sizes of elements (or components) in the drawings are arbitrarily shown for convenience of description, thus, the spirit and scope of the present disclosure are not necessarily defined by the drawings.

Reference will now be made in detail to example embodiments, examples of which are illustrated in the accompanying drawings, wherein like reference numerals refer to like elements (or components) throughout and redundant descriptions thereof may be omitted.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

Also, any numerical range recited herein is intended to include all sub-ranges of the same numerical precision subsumed within the recited range. For example, a range of "1.0 to 10.0" or between "1.0 and 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such sub-ranges would comply with the requirements of 35 U.S.C. § 112, first paragraph, and 35 U.S.C. § 132(a).

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

FIG. 1 is a cross-sectional view of an organic light-emitting display apparatus, according to an example embodiment.

Referring to FIG. 1, the organic light-emitting display apparatus according to the present example embodiment includes a substrate 10 including a black pigment, a pixel electrode 80 above the substrate 10, a pixel defining layer 90 above the pixel electrode 80 and having an opening 90H for exposing at least a portion of the pixel electrode 80, an intermediate layer 100 above the pixel electrode 80 and including an emission layer (EML), and an opposite electrode 110 above the intermediate layer 100.

The substrate 10 may include various suitable materials such as a glass material, a plastic material, a metal material, or the like. In particular, the substrate 10 may include various suitable materials each having a flexible or bendable characteristic. For example, the substrate 10 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 10 includes the black pigment. The black pigment may include at least one of aniline black ($C_{66}H_{51}Cr_3N_{11}O_{12}$), carbon black, lamp black, graphite, Paliogen® Black ($C_{40}H_{26}N_2O_4$), and perylene black ($C_{40}H_{26}N_2O_6$).

When the substrate 10 includes the black pigment, the substrate 10 appears black so that a light absorbance of the substrate 10 is increased as compared with a typical substrate that does not include black pigment. Therefore, light reflectance of the substrate 10 is decreased so that reflectance of external light by the organic light-emitting display apparatus is decreased. Accordingly, visibility of the organic light-emitting display apparatus is improved.

The organic light-emitting display apparatus may be a top-emission type organic light-emitting display apparatus in which light emitted from the EML (to be described below) passes through the opposite electrode 110 to the outside of the organic light-emitting display apparatus.

According to the present example embodiment, the light absorbance of the substrate 10 including the black pigment of light in a visible ray range may be at least 90%. In this regard, the visible ray range indicates a range of light which has a wavelength between about 380 nm and about 780 nm.

Because the external light reflected from the substrate 10 is a part of the external light totally reflected from the organic light-emitting display apparatus, unless the light reflectance of the substrate 10 is significantly decreased, the entire external light reflection is not affected. Thus, when the light absorbance of the substrate 10 is set to be at least 90%, overall light reflectance of the organic light-emitting display apparatus with respect to external light may be significantly decreased.

FIGS. 9A-9C show experimental data obtained by measuring the light absorbance of the substrate 10 according to a thickness of the substrate 10 including polyimide (PI) and a carbon black percentage (%) of the substrate 10. In this regard, cases in which the light absorbance is equal to or greater than 90% are shown in bold.

As shown in FIGS. 9A-9C, when a percentage of a black pigment is increased, the substrate 10 becomes blacker such that the light absorbance of the substrate 10 is increased, and transmittance and reflectance are decreased. When the thickness of the substrate 10 is increased, light transmittance is decreased such that the light absorbance is increased.

According to the present example embodiment, the black pigment included in the substrate 10 including polyimide (PI) is carbon black, and a weight percentage of carbon black with respect to the substrate 10 may be between about 1% and about 15%. Referring to FIGS. 9A-9C, when the weight percentage of carbon black is less than 1%, the light absorbance of the substrate 10 becomes less than 90%. Even in this case, reflectance of the substrate 10 is decreased compared to a case in which carbon black was excluded, but overall light reflectance of the organic light-emitting display apparatus is not greatly affected. When the weight percentage of carbon black becomes greater than 15%, the light absorbance of the substrate 10 is increased to close to 100%, such that the reflectance of the substrate 10 may be decreased to close to 0%, but, because a ratio of the black pigment to the substrate 10 is increased in the substrate 10, flexibility of the substrate 10 may deteriorate.

In particular, when the weight percentage of carbon black is between about 1% and about 15%, the light absorbance of the substrate 10 becomes greater than about 90%, provided that a thickness of the substrate 10 is equal to or greater than 5 μm. In this regard, when the thickness of the substrate 10 is equal to or greater than 20 μm, the light absorbance of the substrate 10 may become greater than about 99%.

According to the present example embodiment, a thickness $h_1$ of the substrate 10 may be between about 5 μm and about 40 μm. When the thickness $h_1$ of the substrate 10 is greater than 40 μm, flexibility of the substrate 10 deteriorates. On the other hand, when the thickness $h_1$ of the substrate 10 is less than 5 μm, the light absorbance and rigidity of the substrate 10 may be decreased.

When the substrate 10 includes the black pigment as described above, the substrate 10 appears black and light absorbance and rigidity of the substrate 10 is increased as compared with a typical substrate that does not include the black pigment. Accordingly, light reflectance of the substrate 10 is decreased so that overall light reflectance of the organic light-emitting display apparatus with respect to external light may be significantly decreased. That is, reflectance of the substrate 10 including the black pigment is decreased about 5% as compared with a case in which the substrate 10 does not include the black pigment. Therefore, visibility of the organic light-emitting display apparatus is improved.

Elements (or components) above the substrate 10 are described hereinbelow.

Referring back to FIG. 1, a buffer layer 11 including inorganic materials such as silicon oxide, silicon nitride and/or silicon oxynitride may be above the substrate 10. The buffer layer 11 may improve planarization of a top surface of the substrate 10, or may prevent, substantially prevent, or reduce penetration of impurities from the substrate 10 into an active layer 20 of a thin film transistor TFT. The buffer layer 11 may be omitted in some embodiments.

The thin film transistor TFT may be arranged above the substrate 10 and may be electrically connected to a pixel electrode 80. The thin film transistor TFT may include the active layer 20 including a semiconductor material such as amorphous silicon, polysilicon, an oxide semiconductor, an organic semiconductor material, or the like; a gate electrode 40 insulated from the active layer 20; and source and drain electrodes 61 and 62 that are electrically connected to the active layer 20. The gate electrode 40 is above the active layer 20, and in response to a signal applied to the gate electrode 40, the source and drain electrodes 61 and 62 are electrically connected. The gate electrode 40 may be formed as a single layer or a multi-stack layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of adhesion to an adjacent layer, planarization of a surface of a stack-target layer, formability, and/or the like.

In order to insulate the active layer 20 from the gate electrode 40, a first insulating layer 30 including an inorganic material such as silicon oxide, silicon nitride, and/or silicon oxynitride may be interposed between the active layer 20 and the gate electrode 40. In addition, a second insulating layer 50 including an inorganic material such as silicon oxide, silicon nitride, and/or silicon oxynitride may be above the gate electrode 40, and the source and drain electrodes 61 and 62 may be above the second insulating layer 50. The source and drain electrodes 61 and 62 may be electrically connected to the active layer 20 through contact-holes formed in the second insulating layer 50 and the first insulating layer 30.

A third insulating layer 70 covering the thin film transistor TFT may be arranged above the thin film transistor TFT. The third insulating layer 70 may have a flat top surface allowing the pixel electrode 80 to be formed flat thereon. The third insulating layer 70 may include an organic material such as acryl, benzocyclobutene (BCB), polyimide, hexamethyldisiloxane (HMDSO), or the like. Referring to FIG. 1, the third insulating layer 70 is a single layer in some embodiments, but the third insulating layer 70 may be a multi-stack layer in other embodiments.

The third insulating layer 70 includes a via hole 70H that exposes one of the source and drain electrodes 61 and 62 of the thin film transistor TFT, and the pixel electrode 80 is electrically connected to the thin film transistor TFT by contacting one of the source and drain electrodes 61 and 62 through the via hole 70H. Referring to FIG. 1, as an example, the pixel electrode 80 is connected to the drain electrode 62.

An organic light-emitting device OLED may be above the third insulating layer 70 and includes the pixel electrode 80, the intermediate layer 100 above the pixel electrode 80 and including the EML, and the opposite electrode 110.

The pixel electrode 80 may be formed as a reflective electrode. When the pixel electrode 80 is formed as a reflective electrode, the pixel electrode 80 may include a reflective layer including Ag, Mg, Al, Pt, Pd, Au, Ni, Nd, Ir, Cr, or a compound thereof, and a transparent conductive layer disposed above and/or below the reflective layer. The transparent conductive layer may include at least one of ITO, IZO, ZnO, $In_2O_3$, indium oxide, IGO, and AZO. However, the present disclosure is not limited thereto, and the pixel electrode 80 may include at least one of various suitable materials and may have a single-layer structure or a multilayer structure.

The pixel defining layer 90 may be arranged above the third insulating layer 70 so as to cover side regions of the pixel electrode 80. The pixel defining layer 90 defines a pixel and has the opening 90H exposing at least a portion of the pixel electrode 80. The pixel defining layer 90 may include an organic material such as polyimide, hexamethyldisiloxane (HMDSO), or the like. The pixel defining layer 90 may be formed as a single layer or a multi-stack layer.

The intermediate layer 100 is above the pixel electrode 80, the pixel electrode 80 being exposed by the pixel defining layer 90. The intermediate layer 100 may include the EML including a small-molecule or polymer material. When the EML includes the small-molecule material, the intermediate layer 100 may have a structure in which a hole injection layer (HIL), a hole transport layer (HTL), the EML, an electron transport layer (ETL), an electron injection layer (EIL), and/or the like are singularly or multiply stacked, and the EML may include various suitable organic materials including copper phthalocyanine (CuPc), N, N'-Di (naphthalene-1-yl)-N, N'-diphenyl-benzidine (NPB), tris-8-hydroxyquinoline aluminum (Alq3), and/or the like. The aforementioned layers may be formed by using a vacuum deposition method. When the EML includes the polymer material, the intermediate layer 100 may have a structure generally including the HTL and the EML. In this regard, the HTL may include poly-(2,4)-ethylene-dihydroxy thiophene (PEDOT), and the EML may include poly-phenylene vinylene (PPV)-based polymer materials, polyfluorene-based polymer materials, and/or the like.

The intermediate layer 100 is not limited thereto and thus may have one of various suitable structures. In addition, the intermediate layer 100 may include one layer extending over a plurality of the pixel electrodes 80, or may include a layer that is patterned to correspond to each of the pixel electrodes 80.

The opposite electrode 110 may be above the intermediate layer 100. Unlike the pixel electrode 80, the opposite electrode 110 may be formed as one body extending over a plurality of pixels.

The opposite electrode 110 may be formed as a translucent electrode. When the opposite electrode 110 is formed as the translucent electrode, the opposite electrode 110 may include at least one of Ag, Al, Mg, Li, Ca, Cu, LiF/Ca, LiF/Al, MgAg and CaAg and may be formed as a thin layer with a thickness of several to several tens of nanometers. However, a structure and material of the opposite electrode 110 are not limited thereto and thus may vary.

According to the present example embodiment, the organic light-emitting display apparatus may further include a capping layer 120 above the opposite electrode 110, a cover layer 121 above the capping layer 120, and a thin-film encapsulation layer 160 above the cover layer 121.

Referring back to FIG. 1, the capping layer 120 may be above the opposite electrode 110. The capping layer 120 has a refractive index lower than that of the opposite electrode 110, and may improve a luminescent efficiency by decreasing a percentage of light generated in the intermediate layer 100 including the EML, the light being totally reflected and thus not emitted to the outside of the organic light-emitting display apparatus.

For example, the capping layer 120 may include an organic material such as Poly(3,4-ethylenedioxythiophene) (PEDOT), 4,4'-bis[N-(3-methylphenyl)-N-phenylamino] biphenyl (TPD), 4,4',4''-tris[(3-methylphenyl)phenylamino] triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAT), 1,3,5-tris[N,N-bis(4-methylphenyl)-amino]-benzene (p-MTDAB), 4,4'-bis[N,N-bis(3-methylphenyl)-amino]-diphenyl methane (BPPM), 4,4'-dicarbazolyl-1,1'-biphenyl (CBP), 4,4',4''-tris (N-carbazoyl)triphenylamine (TCTA), 2,2',2''-(1,3,5-benzenetolyl)tris-[1-phenyl-1H-benzimidazole] (TPBI), 3-(4-biphenyl)-4-phenyl-5-t-butylphenyl-1,2,4-triazole (TAZ), and/or the like.

Alternatively, the capping layer 120 may include an inorganic material such as zinc oxide, titanium oxide, zirconium oxide, silicon nitride, niobium oxide, tantalum oxide, tin oxide, nickel oxide, indium nitride, gallium nitride, or the like. However, a material of the capping layer 120 is not limited thereto, and the capping layer 120 may include various suitable materials.

The cover layer 121 may be placed above the capping layer 120. The cover layer 121 protects the organic light-emitting device OLED against damage that may occur during a subsequent process using plasma, etc. The cover layer 121 may include lithium fluoride (LiF).

The thin-film encapsulation layer 160 may be above the cover layer 121. The thin-film encapsulation layer 160 may include a first inorganic layer 161, an organic layer 162, and a second organic layer 163 that are stacked sequentially above the opposite electrode 110. The first inorganic layer 161 may include silicon oxide, silicon nitride and/or silicon oxynitride. Because the first inorganic layer 161 is formed at a lower side of the thin-film encapsulation layer 160, a surface of the first inorganic layer 161 may not be flat as shown in FIG. 1. The organic layer 162 may cover the first inorganic layer 161 and thus may form a flat top surface. The organic layer 162 may include at least one of polyethylene terephthalate, polyethylene naphthalate, polycarbonate, polyimide, polyethylenesulfonate, polyoxymethylene, polyarylate, and hexamethyldisiloxane. The second organic layer 163 may cover the organic layer 162 and may include silicon oxide, silicon nitride, and/or silicon oxynitride.

The thin-film encapsulation layer 160 encapsulates the organic light-emitting device OLED so as to prevent, substantially prevent, or reduce the organic light-emitting device OLED from being exposed to exterior air or foreign substances. Because the thin-film encapsulation layer 160 has a very small thickness, the thin-film encapsulation layer 160 may be used as an encapsulation unit or encapsulation layer of a bendable or foldable flexible display apparatus.

Referring to FIG. 1, the thin-film encapsulation layer 160 includes only one organic layer 162, but the thin-film encapsulation layer 160 may have a structure in which organic layers and inorganic layers are alternately stacked.

Figure 2:
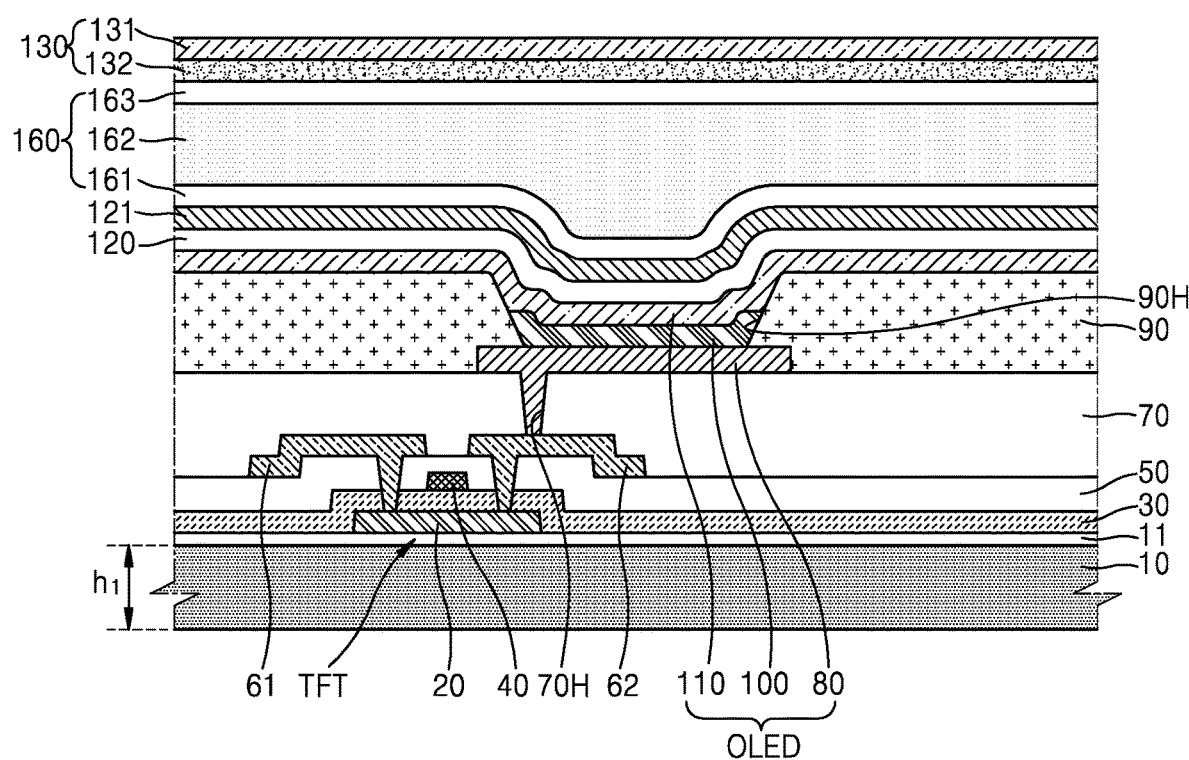
FIG. 2 is a cross-sectional view of the organic light-emitting display apparatus, according to another example embodiment.

FIG. 2 is a cross-sectional view of the organic light-emitting display apparatus, according to another example embodiment.

According to the present example embodiment, the organic light-emitting display apparatus may further include a polarizing layer 130 above the thin-film encapsulation layer 160. Referring to FIG. 2, the polarizing layer 130 may include a phase-retarding film 132 above the thin-film encapsulation layer 160, and a linear polarization film 131 above the phase-retarding film 132. The linear polarization film 131 linearly polarizes transmitted light, and the phase-retarding film retards a phase of the transmitted light. For example, the phase-retarding film 132 may retard a phase of light by 45 degrees, i.e., ¼ of the phase. In this regard, the light that is linearly polarized while passing through the linear polarization film 131 is circularly polarized after passing through the phase-retarding film 132. The polarizing layer 130 includes one phase-retarding film 132 according to FIG. 2, but the polarizing layer 130 may include several phase-retarding films 132.

External light incident on the polarizing layer 130 is linearly polarized by the linear polarization film 131 and is circularly polarized by the phase-retarding film 132. When the circularly polarized external light is reflected in the organic light-emitting display apparatus, the circularly polarized external light rotates in an opposite direction, so that a polarization direction of the external light while passing through the phase-retarding film 132 is perpendicular to a polarization direction of the external light while passing through the linear polarization film 131. Therefore, the reflected light does not pass through the linear polarization film 131, and thus reflection of the external light may be prevented, substantially prevented, or reduced.

According to the present example embodiment, reflectance of the organic light-emitting display apparatus including the polarizing layer 130 may be equal to or less than about 5%. The reflectance refers to a ratio of light incident on the organic light-emitting display apparatus to an intensity of reflected light. When the substrate 10 includes a black pigment, and the organic light-emitting display apparatus includes the polarizing layer 130, reflectance of external light may be decreased to 5% or lower. In this case, visibility of the organic light-emitting display apparatus may be improved.

Figure 3:
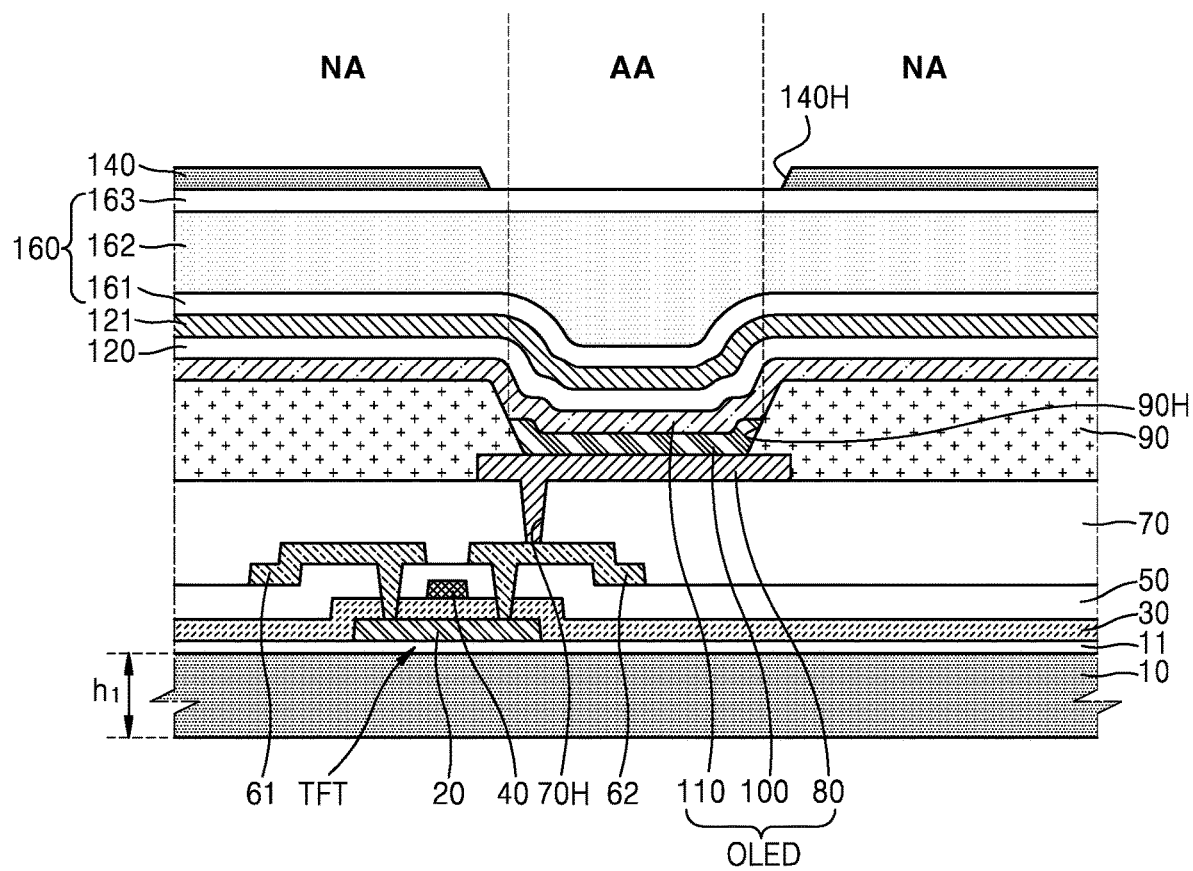
FIG. 3 is a cross-sectional view of the organic light-emitting display apparatus, according to another example embodiment.

FIG. 3 is a cross-sectional view of the organic light-emitting display apparatus, according to another example embodiment.

According to the present example embodiment, the organic light-emitting display apparatus may further include a black matrix 140. Referring to FIG. 3, the black matrix 140 is in a non-emission area NA above the thin-film encapsulation layer 160. The black matrix 140 may have an opening 140H that exposes at least a portion of an emission area AA. In this regard, the emission area AA indicates an area that planarly overlaps an area of the intermediate layer 100, i.e., the area where the EML emits light. The non-emission area NA indicates other areas excluding the emission area AA.

The black matrix 140 may transmit (e.g., allow to be transmitted), via the emission area AA, light generated in the EML in the intermediate layer 100, and may absorb, via the non-emission area NA, light from the outside of the organic light-emitting display apparatus. By doing so, a contrast and a luminescent efficiency of the organic light-emitting display apparatus may be improved. The black matrix 140 may include various suitable materials, e.g., an organic material mixed with a black pigment, chromium (Cr), chromium oxide ($CrO_x$), and/or the like. When the black matrix 140 includes chromium (Cr) or chromium oxide ($CrO_x$), the black matrix 140 may be a single layer or a multi-stack layer including chromium (Cr) or chromium oxide (CrOx).

When the organic light-emitting display apparatus includes the black matrix 140 as described above, the organic light-emitting display apparatus may sufficiently prevent, substantially prevent, or reduce reflection of external light, without the polarizing layer 130 of which a thickness is about 100 μm, so that flexibility of the organic light-emitting display apparatus may be improved. However, because the black matrix 140 decreases light reflectance in the non-emission area NA, a unit to decrease light reflectance in the emission area AA may be separately used.

According to the present example embodiment, the opposite electrode 110 may be a low-reflection layer. Because the opposite electrode 110 is not only in the non-emission area NA but also in the emission area AA, the opposite electrode 110 may decrease overall light reflectance of the organic light-emitting display apparatus by decreasing light reflectance in the emission area AA. The opposite electrode 110 may include a plurality of material layers each having a different refractive index, and thus may perform a low-reflection function by allowing light reflected from each interface to be destructively interfered. Alternatively, the low-reflection function may be achieved by oxidizing a surface of the opposite electrode 110.

As described above, when the organic light-emitting display apparatus includes the black matrix 140, the substrate 10 includes the black pigment, and the opposite electrode 110 is formed as the low-reflection layer, reflectance of the organic light-emitting display apparatus with respect to external light may be decreased to about 6% or lower.

Figure 4:
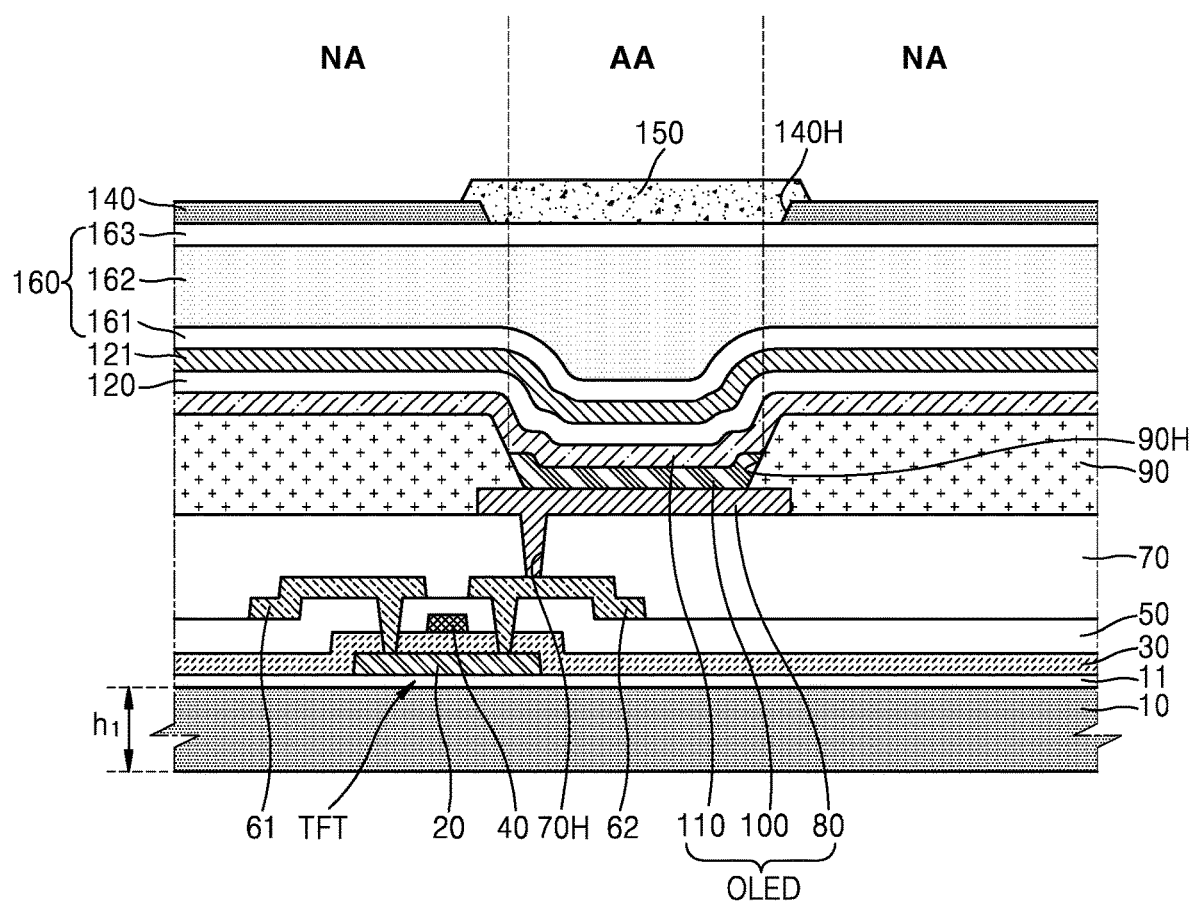
FIG. 4 is a cross-sectional view of the organic light-emitting display apparatus, according to another example embodiment.

FIG. 4 is a cross-sectional view of the organic light-emitting display apparatus, according to another example embodiment.

Referring to FIG. 4, the organic light-emitting display apparatus may further include a color filter 150. The color filter 150 may cover the opening 140H of the black matrix 140. The color filter 150 may include a coloring material and an organic material for dispersing the coloring material. The coloring material may be a general pigment material or dye, and the organic material may be a general dispersant.

When white light is emitted from the organic light-emitting device OLED, the color filter 150 may selectively transmit light with a particular wavelength, such as light having a red color, a green color, or a blue color, and may absorb light with other suitable wavelengths, so that the color filter 150 may allow each pixel to emit light of a red color, a green color, or a blue color. Because the color filter 150 having a red color, a green color, or a blue color is arranged in each of the emission areas AA, the emission areas AA may each emit light with a red color, a green color, or a blue color.

When the organic light-emitting device OLED emits visible light having a particular color, e.g., red visible light, green visible light, and blue visible light, the color filter 150 may enhance a luminescent quality of the visible light.

The color filter 150 may overlap the emission area AA and may overlap a portion of the non-emission area NA. That is, the color filter 150 may decrease light reflectance in the emission area AA. When the organic light-emitting display apparatus includes the black matrix 140 and the color filter 150, and the substrate 10 includes the black pigment, reflectance of external light may be decreased to about 5% or lower.

Hereinafter, with reference to FIGS. 5 through 8, a method of manufacturing the organic light-emitting display apparatus will now be described.

Referring to FIGS. 5 through 8, the method of manufacturing the organic light-emitting display apparatus according to the present example embodiment may include an operation of forming the substrate 10 by hardening a substrate composition 10' including a black pigment BP; an operation of forming the pixel electrode 80 above the substrate 10; an operation of forming, above the pixel electrode 80, the pixel defining layer 90 having the opening 90H for exposing at least a portion of the pixel electrode 80; an operation of forming, above the pixel electrode 80, the intermediate layer 100 including the EML; and an operation of forming the opposite electrode 110 above the intermediate layer 100.

Figure 5:
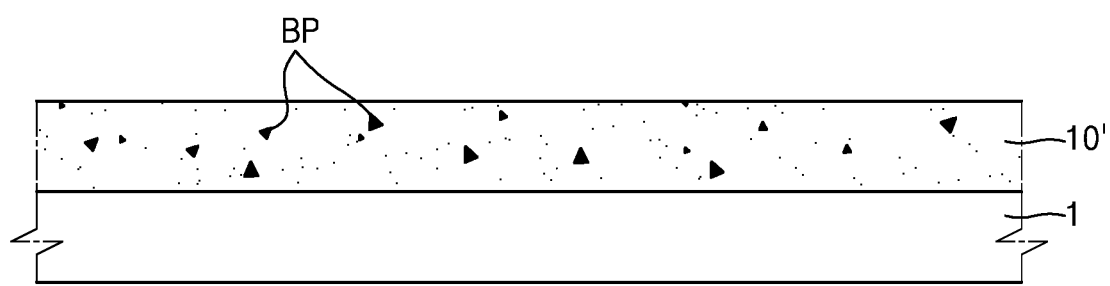
FIGS. 5 through 8 are cross-sectional views illustrating some processes of a method of manufacturing the organic light-emitting display apparatus, according to example embodiments.

Referring to FIG. 5, the substrate composition 10' including the black pigment BP is coated on a carrier substrate 1. After elements (or components) of the organic light-emitting display apparatus are all stacked, the carrier substrate 1 may be separated from the substrate 10. Hereinafter, for convenience, the carrier substrate 1 is not illustrated in the drawings.

The substrate composition 10' may be a precursor solution of polyethersulphone (PES), polyacrylate (PAR), polyetherimide (PEI), polyethylene napthalate (PEN), polyethyelene terepthalate (PET), polyphenylene sulfide (PPS), polyarylate, polyimide (PI), polycarbonate (PC), cellulose acetate propionate (CAP), and/or the like. For example, the substrate composition 10' may be a polyamic acid composition solution that is a precursor of polyimide (PI).

According to the present example embodiment, the black pigment BP included in the substrate composition 10' may include at least one of aniline black ($C_{66}H_{51}Cr_3N_{11}O_{12}$), carbon black, lamp black, graphite, Paliogen® Black ($C_{40}H_{26}N_2O_4$), perylene black ($C_{40}H_{26}N_2O_6$), and/or the like.

According to the present example embodiment, the substrate 10 may include polyimide (PI), the black pigment BP included in the substrate composition 10' may be carbon black, and a weight percentage of the carbon black with respect to the substrate composition 10' may be between about 1% and about 15%.

Figure 6:
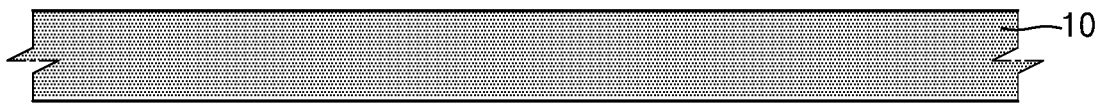

Referring to FIG. 6, the substrate 10 is formed by hardening the substrate composition 10'. For example, the substrate 10 including polyimide (PI) may be formed by hardening the polyamic acid composition solution. Because the substrate composition 10' includes the black pigment BP, the substrate 10 formed by hardening the substrate composition 10' has a black color. In this regard, a thickness of the substrate 10 may be between about 5 μm and about 40 μm.

Figure 7:
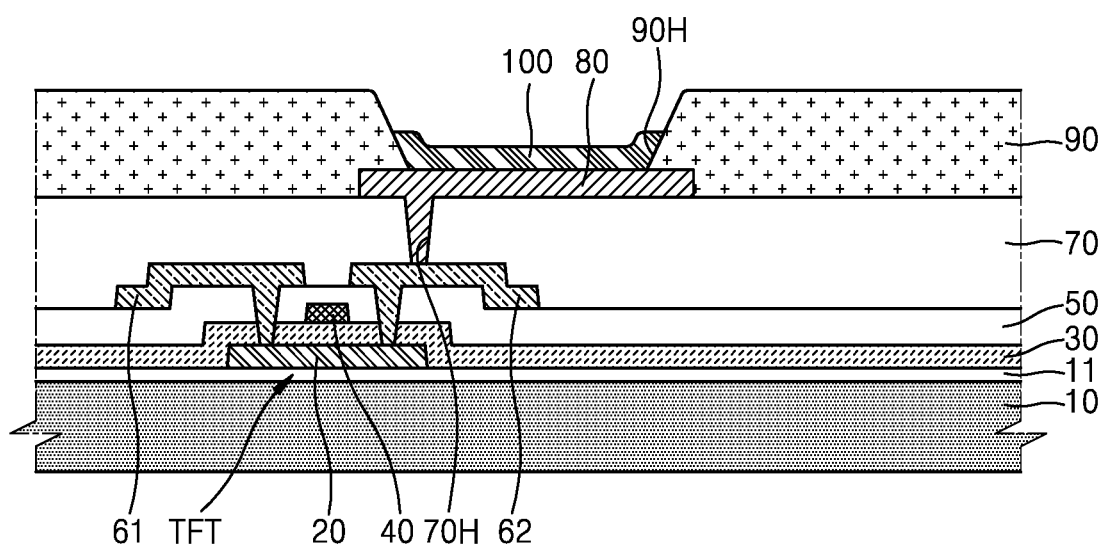

Referring to FIG. 7, the thin film transistor TFT is formed above the substrate 10, the third insulating layer 70 is formed above the thin film transistor TFT, the pixel electrode 80 is formed so as to cover the via hole 70H of the third insulating layer 70, the pixel defining layer 90 is formed with an opening for exposing at least a portion of the pixel electrode 80, and the intermediate layer 100 including the EML is formed above the pixel electrode 80. These processes may be performed through a well-known photolithographic process, and detailed descriptions thereof are omitted here.

Figure 8:
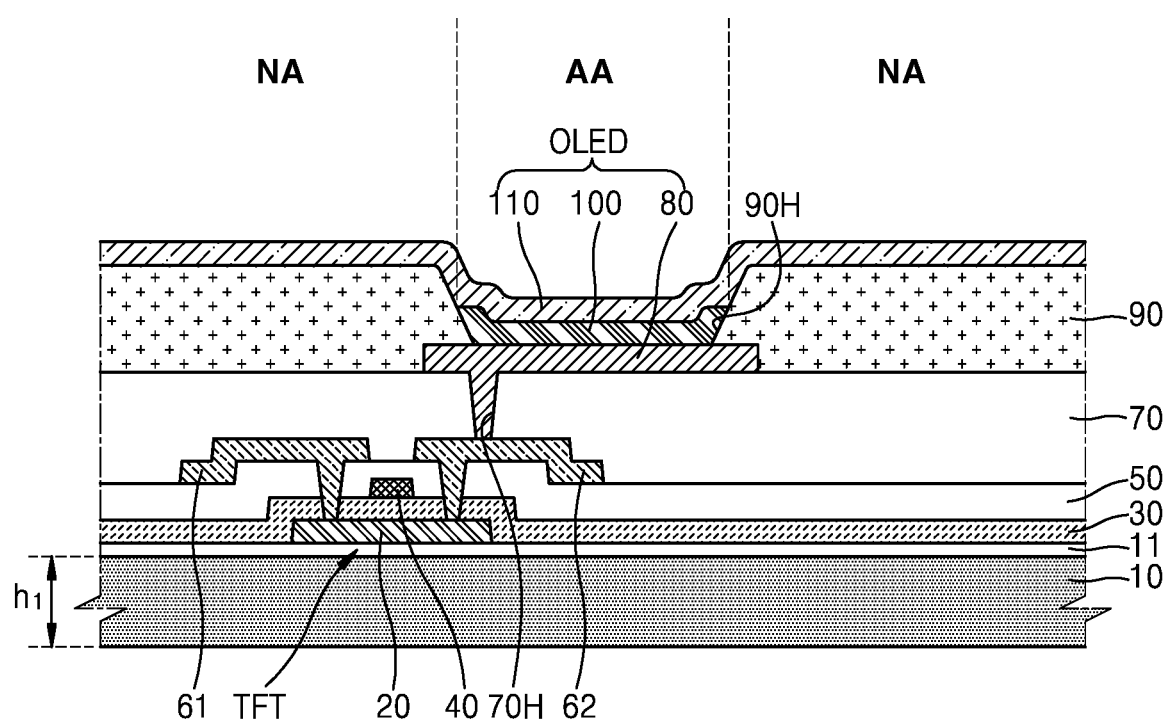

Referring to FIG. 8, the opposite electrode 110 is formed above the intermediate layer 100. Unlike the pixel electrode 80, the opposite electrode 110 may be formed as one body extending over the plurality of pixels.

According to the present example embodiment, the opposite electrode 110 may be formed as the low-reflection layer. Because the opposite electrode 110 is placed not only in the non-emission area NA but also in the emission area AA, the opposite electrode 110 may decrease overall light reflectance of the organic light-emitting display apparatus by decreasing light reflectance in the emission area AA. Although not illustrated, when the opposite electrode 110 is formed, a plurality of material layers each having a different refractive index may be stacked to perform a low-reflection function by allowing light reflected from each interface to be destructively interfered. Alternatively, the low-reflection function may be implemented by oxidizing a surface of the opposite electrode 110.

Referring back to FIG. 1, a method of manufacturing the organic light-emitting display apparatus according to another example embodiment may further include, after the operation of forming the opposite electrode 110, an operation of forming the capping layer 120 above the opposite electrode 110, an operation of forming the cover layer 121 above the capping layer 120, and an operation of forming the thin-film encapsulation layer 160 above the cover layer 121.

According to another example embodiment, after the operation of forming the thin-film encapsulation layer 160, an operation of forming the polarizing layer 130 above the thin-film encapsulation layer 160 may also be performed. Referring back to FIG. 2, after the operation of forming the thin-film encapsulation layer 160, the phase-retarding film 132 is formed. Afterwards, the linear polarization film 131 is formed above the phase-retarding film 132, thereby completing the formation of the polarizing layer 130. When the substrate 10 includes the black pigment, and the organic light-emitting display apparatus includes the polarizing layer 130, reflectance of external light may be decreased to about 5% or lower. Therefore, visibility of the organic light-emitting display apparatus may be improved.

A method of manufacturing the organic light-emitting display apparatus according to another example embodiment may further include, after the operation of forming the thin-film encapsulation layer 160, an operation of forming the black matrix 140. Referring back to FIG. 3, after the operation of forming the thin-film encapsulation layer 160, the black matrix 140 having the opening 140H for exposing at least a portion of the emission area AA may be formed above the thin-film encapsulation layer 160.

The black matrix 140 may include various suitable materials, e.g., an organic material mixed with a black pigment, chromium (Cr), chromium oxide ($CrO_x$), and/or the like. The black matrix 140 may be a single layer or a multi-stack layer including chromium (Cr) or chromium oxide ($CrO_x$). In this regard, the black matrix 140 including chromium (Cr) or chromium oxide ($CrO_x$) may be formed by using a sputtering method or an e-beam deposition method. Because the black matrix 140 decreases light reflectance in the non-emission area NA, a unit for decreasing light reflectance in the emission area AA may be separately used.

According to the present example embodiment, after the operation of forming the black matrix 140, an operation of arranging the color filter 150 may also be performed. Referring back to FIG. 4, the color filter 150 may cover the opening 140H of the black matrix 140. That is, the color filter 150 may overlap the emission area AA and may overlap a part of the non-emission area NA. That is, the color filter 150 may decrease the light reflectance in the emission area AA. When the organic light-emitting display apparatus includes the black matrix 140 and the color filter 150, and the substrate 10 includes the black pigment, reflectance of external light may be decreased to about 5% or lower.

As described above, by forming the opposite electrode 110 as the low-reflection layer, the light reflectance in the emission area AA may be decreased.

As described above, when the organic light-emitting display apparatus is manufactured while the substrate 10 includes the black pigment, the substrate 10 appears black, and the light absorbance of the substrate 10 is increased as compared with a substrate of the related art excluding the black pigment. Accordingly, the light reflectance of the substrate 10 is decreased so that overall light reflectance of external light by the organic light-emitting display apparatus is decreased. Therefore, visibility of the organic light-emitting display apparatus is improved.

According to the organic light-emitting display apparatus and the method of manufacturing the organic light-emitting display apparatus according to the example embodiments of the present disclosure, a substrate including a black pigment appears black, thus, compared to a substrate of the related art excluding the black pigment, a light absorbance of the substrate is increased and light reflectance of the substrate is decreased so that overall reflectance of external light is decreased, and visibility of the organic light-emitting display apparatus is improved. However, the scope of the present disclosure is not limited to the example embodiments.

While one or more example embodiments have been described with reference to the figures, it will be understood by one of ordinary skill in the art that various changes in form and details may be made therein without departing from the spirit and scope of the present invention disclosure as defined by the following claims and their equivalents.

What is claimed is:

1. An organic light-emitting display apparatus comprising:
   a substrate comprising a black pigment;
   a pixel electrode above the substrate;
   a pixel defining layer above the pixel electrode and having an opening for exposing at least a portion of the pixel electrode;
   an intermediate layer above the pixel electrode and comprising an emission layer (EML);
   an opposite electrode above the intermediate layer;
   a black matrix arranged above the opposite electrode, the black matrix having an opening that exposes at least a portion of an emission area;
   a capping layer above the opposite electrode;
   a cover layer above the capping layer; and
   a thin-film encapsulation layer above the cover layer,
   wherein a weight percentage of the black pigment with respect to the substrate is between about 1% and about 15%.

2. The organic light-emitting display apparatus of claim 1, wherein the black pigment comprises at least one of aniline black ($C_{66}H_{51}Cr_3N_{11}O_{12}$), carbon black, lamp black, graphite, Paliogen® Black ($C_{40}H_{26}N_2O_4$), and perylene black ($C_{40}H_{26}N_2O_6$).

3. The organic light-emitting display apparatus of claim 1, wherein a light absorbance, of light in a visible ray range, of the substrate is equal to or greater than about 90%.

4. The organic light-emitting display apparatus of claim 1, wherein a thickness of the substrate is between about 5 μm and about 40 μm.

5. The organic light-emitting display apparatus of claim 1, further comprising a polarizing layer above the thin-film encapsulation layer.

6. The organic light-emitting display apparatus of claim 5, wherein reflectance of the organic light-emitting display apparatus comprising the polarizing layer is equal to or less than about 5%.

7. An organic light-emitting display apparatus comprising:
   a substrate comprising a black pigment;
   a pixel electrode above the substrate;
   a pixel defining layer above the pixel electrode and having an opening for exposing at least a portion of the pixel electrode;
   an intermediate layer above the pixel electrode and comprising an emission layer (EML);
   an opposite electrode above the intermediate layer;
   a capping layer above the opposite electrode;
   a cover layer above the capping layer;
   a thin-film encapsulation layer above the cover layer; and
   a black matrix arranged above the thin-film encapsulation layer, the black matrix having an opening that exposes at least a portion of an emission area.

8. The organic light-emitting display apparatus of claim 7, wherein the opposite electrode comprises a low-reflection layer.

9. The organic light-emitting display apparatus of claim 7, further comprising a color filter that covers the opening of the black matrix.

10. The organic light-emitting display apparatus of claim 9, wherein reflectance of the organic light-emitting display apparatus comprising the color filter is equal to or less than about 5%.

11. A method of manufacturing an organic light-emitting display apparatus, the method comprising:
    forming a substrate by hardening a substrate composition comprising a black pigment;
    forming a pixel electrode above the substrate;
    forming, above the pixel electrode, a pixel defining layer having an opening for exposing at least a portion of the pixel electrode;
    forming, above the pixel electrode, an intermediate layer comprising an emission layer (EML);
    forming an opposite electrode above the intermediate layer;
    forming a capping layer above the opposite electrode;
    forming a cover layer above the capping layer; and
    forming a thin-film encapsulation layer above the cover layer,
    wherein a black matrix is arranged above the opposite electrode, the black matrix having an opening that exposes at least a portion of an emission area, and
    wherein a weight percentage of the black pigment with respect to the substrate is between about 1% and about 15%.

12. The method of claim 11, wherein the black pigment comprises at least one of aniline black ($C_{66}H_{51}Cr_3N_{11}O_{12}$), carbon black, lamp black, graphite, Paliogen® Black ($C_{40}H_{26}N_2O_4$), and perylene black ($C_{40}H_{26}N_2O_6$).

13. The method of claim 11, wherein a thickness of the substrate is between about 5 μm and about 40 μm.

14. The method of claim 11, further comprising, after the forming of the thin-film encapsulation layer, forming a polarizing layer above the thin-film encapsulation layer.

15. The method of claim 11, further comprising, after the forming of the thin-film encapsulation layer, forming, above the thin-film encapsulation layer, a black matrix having an opening that exposes at least a portion of an emission area.

16. The method of claim 15, further comprising, after the forming of the black matrix, forming a color filter that covers the opening of the black matrix.

17. The organic light-emitting display apparatus of claim 1, wherein the substrate comprises polyimide (PI).

18. The method of claim 11, wherein the substrate comprises polyimide (PI).

* * * * *